United States Patent [19]

Jensen et al.

[11] Patent Number: 5,600,244

[45] Date of Patent: Feb. 4, 1997

[54] METHOD FOR REDUCING INHOMOGENEITY OF SURFACE COILS THROUGH ADDITIONAL DATA FROM HOMOGENEOUS BODY COIL VIA TEMPORALLY SEPARATE ALTIVATION OF THE SURFACE AND BODY COILS

[75] Inventors: Jens D. Jensen, Hamburg; Ingwer C. Carlsen, Kiel, both of Germany

[73] Assignee: U.S. Philips Corporation, New York, N.Y.

[21] Appl. No.: 510,156

[22] Filed: Aug. 2, 1995

[30] Foreign Application Priority Data

Aug. 3, 1994 [DE] Germany ..................... 44 27 429.7

[51] Int. Cl.$^6$ ................................ G01R 33/20
[52] U.S. Cl. .................... 324/309; 324/307; 324/322; 128/653.2
[58] Field of Search .................... 324/300, 307, 324/309, 318, 320, 301, 311, 316, 322; 128/653.2–653.5

[56] References Cited

U.S. PATENT DOCUMENTS

| | | | |
|---|---|---|---|
| 4,812,753 | 3/1989 | Fuderer et al. | 324/318 |
| 4,987,369 | 1/1991 | Van Stapele et al. | 324/307 |
| 5,001,428 | 3/1991 | Maier et al. | 324/309 |
| 5,107,215 | 4/1992 | Schaefer et al. | 324/314 |
| 5,208,534 | 5/1993 | Okamoto et al. | 324/309 |

FOREIGN PATENT DOCUMENTS

| | | | |
|---|---|---|---|
| 0271123 | 6/1988 | European Pat. Off. | G01R 33/56 |
| 0412824 | 2/1991 | European Pat. Off. | H01R 33/54 |

OTHER PUBLICATIONS

"Going Beyond the SNR Performance of a QD Volume Coil With a Multiple Differential Surface Coil", by K. Okamoto et al, Jul. 1993, p. 4042.

*Primary Examiner*—Louis M. Arana
*Assistant Examiner*—Roger C. Phillips
*Attorney, Agent, or Firm*—Jack D. Slobod

[57] ABSTRACT

An MR method is presented for determining the nuclear magnetization distribution in an examination zone, the image data acquired during an MR examination by means of a surface coil arrangement, comprising at least one coil and exhibiting a locally inhomogeneous sensitivity, being corrected on the basis of auxiliary values derived from data acquired by means of a body coil arrangement having a locally at least approximately homogeneous sensitivity. Improved reconstruction is achieved in that, in addition to the MR examination, a respective MR auxiliary measurement is performed by means of the surface coil arrangement as well as by means of the body coil arrangement, that the two MR auxiliary measurements are carried out temporally separated from one another and from the MR examination, that during the two MR auxiliary measurements the magnetic fields acting on the examination zone exhibit the same variation in time, and that the auxiliary values are derived from the data acquired during the two MR auxiliary measurements.

7 Claims, 2 Drawing Sheets

METHOD FOR REDUCING INHOMOGENEITY OF SURFACE COILS THROUGH ADDITIONAL DATA FROM HOMOGENEOUS BODY COIL VIA TEMPORALLY SEPARATE ALTIVATION OF THE SURFACE AND BODY COILS

BACKGROUND OF THE INVENTION

1. Field of the Invention

The invention relates to an MR method for determining the nuclear magnetization distribution in an examination zone, in which the image data acquired during an MR examination by means of a surface coil arrangement, having a locally inhomogeneous sensitivity and comprising at least one coil, are corrected on the basis of auxiliary values derived from the data acquired by means of a body coil arrangement having a locally at least approximately homogeneous sensitivity.

2. Description of the Related Art

The determination of the nuclear magnetization distribution in an examination zone by means of a surface coil arrangement comprising at least one surface coil, but in practice usually several surface coils, offers the advantage that the signal-to-noise ratio is substantially better than in the case of coils capable of receiving the spin resonance signals from the entire examination zone; the latter coils, also referred to as whole-body coils or volume coils in practice, will be referred to as a body coil arrangement hereinafter.

The formation of MR images by means of a surface coil arrangement, however, has a drawback in that the sensitivity (the location-dependent sensitivity of an MR coil is defined as the quotient of the magnetic induction at a given location and the current in the coil causing this magnetic induction at this location) is locally inhomogeneous, i.e. dependent on the location where the MR signal occurs in the examination zone. Therefore, the data produced by means of a surface coil arrangement must be corrected so as to eliminate the location-dependent sensitivity differences.

To this end it is known to use a body coil arrangement in addition. Because such an arrangement has a locally homogenous sensitivity, the MR image produced by means of the body coil can be used to correct the data for the MR image formed from the MR signals received from the surface coil arrangement.

In a first method of this kind which is known from EP-A 412 824 as well as from an article by Okamoto et al., SMRM 11th Annual Meeting, p. 4042, 1992, auxiliary values for the correction of the location-dependent sensitivity of the surface coil arrangement are derived from the MR signals acquired by the body coil arrangement simultaneously with the surface coil arrangement.

For this method to be effective it is necessary that no inductive coupling exists between the individual coils of the surface coil arrangement on the one side and the body coil arrangement on the other side. In practice this condition can be satisfied for special cases at best.

In another method, disclosed in EP 271 123, which corresponds to U.S. Pat. No. 4,812,753 the MR examination is carried out separately in time by means of a surface coil arrangement, comprising a single coil, and as an MR auxiliary measurement (even though it also concerns an MR examination, it will be referred to hereinafter as "MR auxiliary measurement") by means of the body coil arrangement. Even though the MR auxiliary measurement can be carried out with a spatial resolution which is less than that of the MR examination by means of the surface coil arrangement, the two MR methods must produce the same contrast behaviour. Consequently, the duration of the MR auxiliary measurement by means of the body coil arrangement is comparatively long and depending on the acquisition method. Moreover, small-volume changes which succeed one another in rapid succession in the zone covered by the two coil arrangements, for example as they may occur in MR angiograms, are a cause of failure of the method, because even the smallest spatil shift between the two images lead to errors.

It is an objective of the present invention to improve a method of the kind set forth. This objective is achieved in accordance with the invention in that, in addition to the MR examination a respective MR auxiliary measurement is carried out by means of the surface coil arrangement as well as by means of the body coil arrangement, in that the two MR auxiliary measurements are carried out temporally separate from one another and from the MR examination, in that during the two MR auxiliary measurements the magnetic fields acting on the examination zone exhibit the same temporal variation, and that the auxiliary values are derived from the data acquired during the two MR auxiliary measurements.

In addition to the MR examination by means of the surface coil arrangement, therefore in accordance with the invention there a (first) MR auxiliary measurement by means of the surface coil arrangement and a (second) MR auxiliary measurement by means of the body coil arrangement are carried out, it being essential that the magnetic fields acting on the examination zone during the two MR auxiliary measurements exhibit the same temporal variation, i.e. that the same sequences act on this zone. In comparison with EP-B 271 123, requiring only one MR examination and one MR auxiliary measurement, it appears in first instance that more time is now required. However, because the two MR auxiliary measurements need not produce the same contrast behaviour as the MR examination, very fast MR methods can be used for this purpose. Moreover, the MR auxiliary measurements require a low spatial resolution only, so that the measuring time for the two MR auxiliary measurements is even further reduced. Furthermore, no problems are encountered when a human vascular system is to be imaged by means of the MR examination, because the two MR auxiliary measurements need not image the vascular system (but only the area in which these vessels are situated), so that the positional changes occurring in the vascular system between the two MR auxiliary measurements have no effect whatsoever on the calibration.

In a further embodiment of the invention, the image data acquired during the MR examination are corrected in that MR superposition images are calculated from the MR image data acquired during the MR auxiliary measurement by means of the surface coil arrangement on the one hand and from the MR image data acquired during the MR examination on the other hand, which MR superposition images are dependent on the location-dependent sensitivity of the surface coil arrangement in the same way, and that auxiliary values are derived from the relation of the MR superposition image obtained from the MR auxiliary measurement to the MR image obtained from the MR auxiliary measurement by means of the body coil arrangement, which auxiliary values are used to correct the MR superposition image derived from the MR examination.

In a preferred embodiment which offers an optimum signal-to-noise ratio, the MR superposition images are formed by weighted summing of the MR images determined by the individual coils of the surface coil arrangement, the weighting factors that are applied to the MR image data of the individual MR images to be summed being derived from the relation of the respective MR image data determined for the same pixel during the two MR auxiliary measurements.

An MR device for carrying out the method in accordance with the invention, includes:

a) a surface coil arrangement comprising at least one coil, b) a body coil arrangement of locally at least approximately homogeneous sensitivity, c) processing means for forming MR images from the MR signals received from the surface coil arrangement and from the body coil arrangement as well as for deriving auxiliary values from the MR images, and d) programmable control means for controlling the variation in time of the magnetic fields acting on the examination zone, and for controlling the MR signal processing is constructed so that the control means are programmed in such a manner that an MR examination, an MR auxiliary measurement by means of the surface coil arrangement, and an MR auxiliary measurement by means of the body coil arrangement are carried out temporally separately, and that the processing means derive auxiliary values from the data acquired during the MR auxiliary measurements, said auxiliary data being used to correct the image data acquired during the MR examination.

In a further embodiment of the invention, the surface coil arrangement and the body coil arrangement can operate in a receiving mode in which they can pick up MR signals and in an decoupling mode in which they cannot pick up MR signals, and that the modes are controlled by the control means in such a manner that the body coil arrangement operates in the decoupling mode when the surface coil arrangement operates in the receiving mode, and vice versa.

BRIEF DESCRIPTION OF THE DRAWING

The invention will be described in detail hereinafter with reference to the drawings. Therein.

DETAILED DESCRIPTION OF THE PREFERRED EMBODIMENTS

Figure 1:
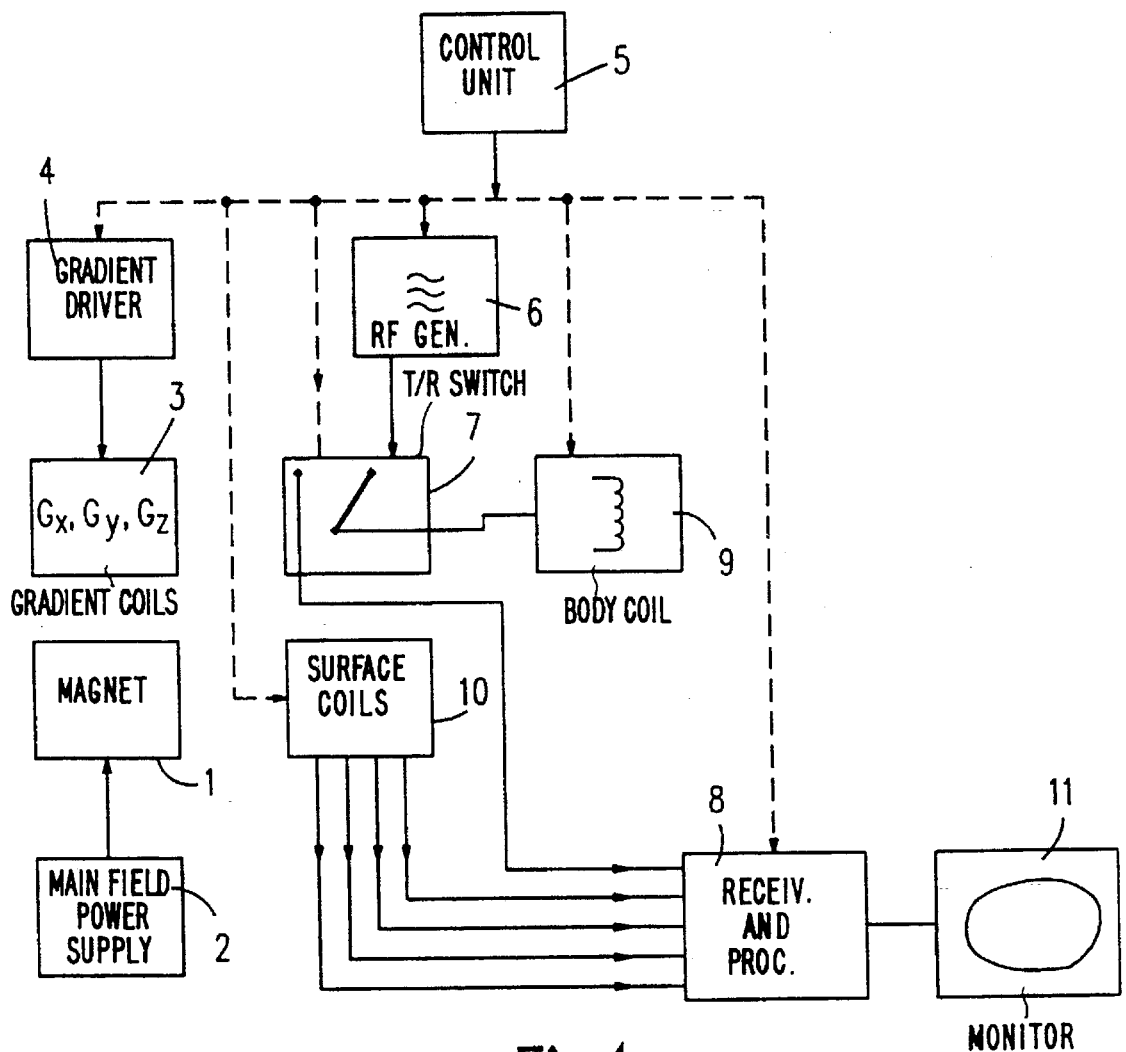
FIG. 1 shows a block diagram of an MR examination apparatus in which the invention can be carried out.

The reference numeral 1 in the block diagram of FIG. 1 denotes a preferably superconducting magnet coil which generates a steady, homogeneous main magnetic field in an examination zone in which a patient may be arranged. The current required for this purpose is established by a power supply unit 2. The reference numeral 3 denotes a gradient coil arrangement which is capable of generating a magnetic gradient field which extends in the direction of the steady magnetic field and whose gradient extends either in the same direction or in two directions which are perpendicular thereto and perpendicular to one another. The currents required for this purpose are supplied by a driver circuit 4, the variation in time of the currents being controlled by a control unit 5 which can be implemented by way of a suitably programmed processor.

There is also provided an RF generator 6 which is capable of generating pulsed oscillations of the Larmor frequency of the spin system. A transmission/reception switching unit 7 connects a body coil arrangement 9 selectably to a receiver unit 8 or to the RF generator 6. The normal cylindrical body coil arrangement encloses the body of the patient over a given length during an MR examination and produces a substantially homogeneous RF magnetic field within the patient. Also provided is a surface coil arrangement 10 which consists of a plurality of surface coils.

The units 6 to 10 are controlled by the control unit 5. In the transmission mode the transmission/reception switching unit 7 is in the position shown in the drawing, so that the oscillations produced by the RF generator 6 are applied to the body coil arrangement 9 which generates an RF magnetic field in the examination zone. The surface coil arrangement is inactive in the transmission mode, for example in that each individual coil of this arrangement is detuned in the transmission mode.

When the transmission/reception switching unit 7 is switched to the other position by the control unit 5, the MR coil arrangement 9 can receive the MR signals arising in the examination zone. Instead of a body coil arrangement acting as a transmission and reception coil, separate coils may be provided for the transmission mode and the receiving mode. It is important that the body coil arrangement provided for the receiving mode also has a spatially at least approximately constant sensitivity.

For each coil of the surface coil arrangement and for the body coil arrangement the receiver unit 8 comprises a respective channel in which the MR signal received by the relevant coil is amplified, transposed to a lower frequency range and digitized, and in which a respective MR image can be reconstructed from the digitized MR signals. The MR images generated in the receiving and processing unit 8 can be displayed on a monitor 11.

Only one of the coil arrangements 9 and 10 is active. When the MR signals are to be received by the body coil arrangement 9, the coils of the surface coil arrangement 10 are detuned by the control unit 5, and when reception is to take place by the surface coil arrangement 10, the body coil arrangement 9 is detuned. These coil arrangements are thus inductively de, coupled from one another.

Figure 2:
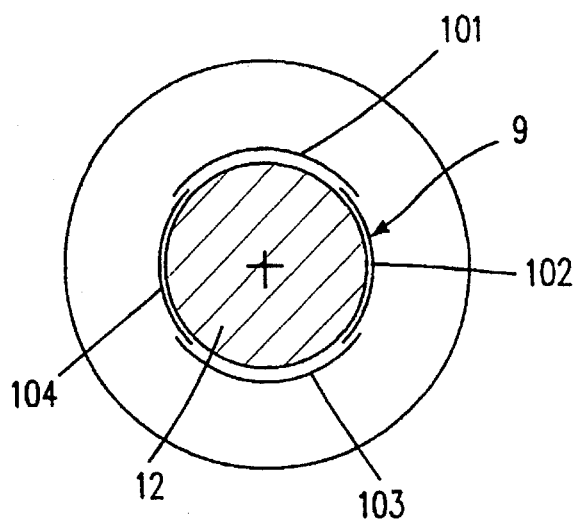
FIG. 2 shows a body coil arrangement and a surface coil arrangement.

FIG. 2 shows the position in space of the coil arrangement 9 which may be, for example a coil of the bird-cage type, as well as the surface coil arrangement consisting of several (four in the present example) separate surface coils 101 . . . 104. The four surface coils 101 to 104 may be arranged on a flexible support (not shown) which is wrapped around the patient. The coils are arranged on the support in such a manner that they overlap in a defined area, so that suitable decoupling is achieved between these surface coils. Between the surface coil arrangement 10, or 101 . . . 104, on the one side and the body coil arrangement 9 on the other side, however, decoupling cannot be achieved.

As has already been stated, the surface coils 101 . . . 104 have a locally inhomogeneous sensitivity, i.e. an MR signal arising at the centre of the object 12 to be examined produces a current in the coils which deviates from the current produced by an MR signal of the same magnitude arising on the surface of the object to be examined. In order to compensate for these differences in sensitivity, therefore, in addition to the MR examination a first MR auxiliary measurement is executed by means of the body coil arrangement 9 and a second MR auxiliary measurement by means of the surface coil arrangement 10. As will be described in detail hereinafter, from these two auxiliary measurements there are derived auxiliary values whereby the MR data acquired during the MR examination are corrected.

Figure 3:
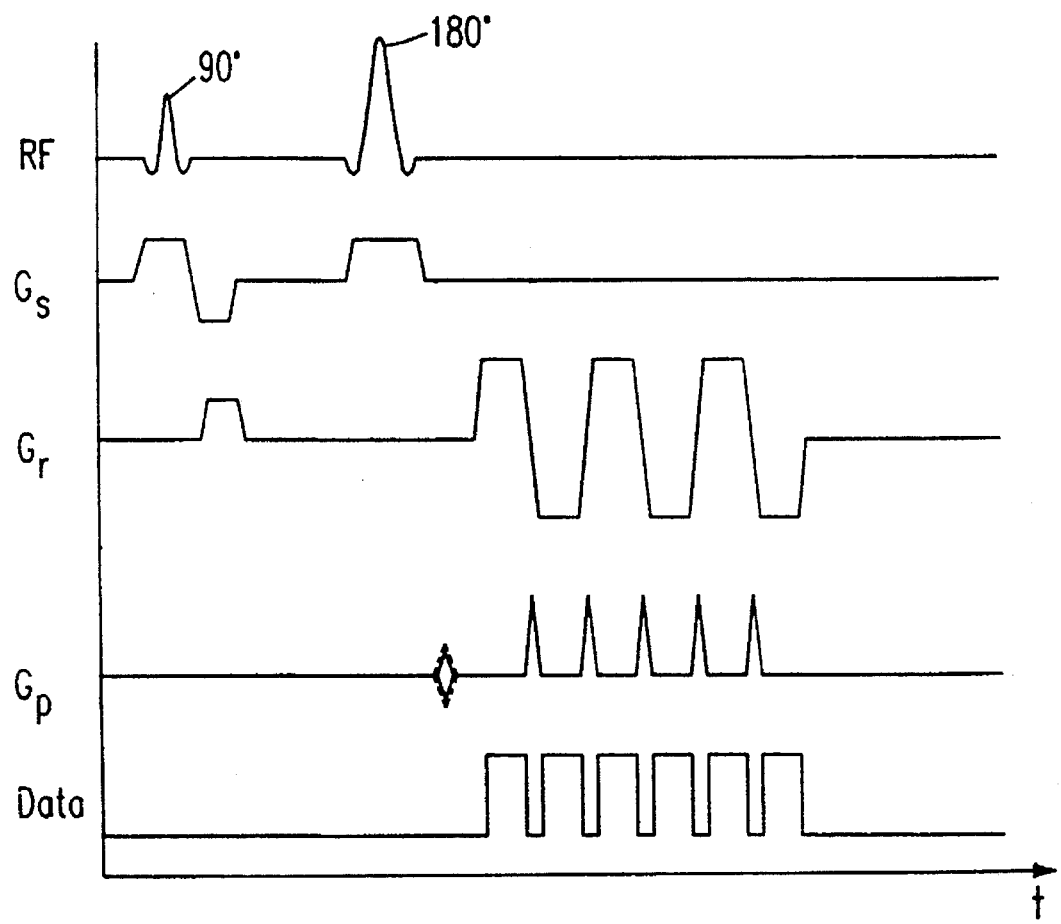
FIG. 3 shows the variation in time of various signals during an MR examination.

FIG. 3 shows a sequence of the EPI type whereby the MR examination can be carried out. The first line of FIG. 3 shows the variation in time of the RF pulses in such a sequence. Therein, a 90° RF pulse is succeeded by a refocusing 180° pulse. Both RF pulses are slice-selective pulses, i.e. they are accompanied by a magnetic gradient field $G_s$ which is shown on the second line of FIG. 3. This gradient field influences the nuclear magnetization in one slice only.

The MR signals arising in the examination zone are read in conjunction with an alternating read gradient $G_r$ whose variation in time is represented on the third line of FIG. 3. The read-out gradient has a positive, constant value during a small time interval and changes in a ramp-like fashion to a negative constant value of the same magnitude and subsequently becomes positive again etc. A phase encoding gradient $G_p$ (fourth line of FIG. 3) is present during each transition between the positive and the negative value.

This variation in time of $G_r$ and $G_p$ results in the scanning of a plurality of mutually parallel offset lines in the k-space which extend in the direction of the read gradient $G_r$. Each time when one of these lines is scanned (i.e. when the read gradient is constant), the MR signals occurring in the form of an echo are read and processed as represented on the fifth line of FIG. 3.

Instead of the EPI sequence shown in FIG. 3, arbitrary other, possibly longer sequences can be used for the MR examination.

The MR signals picked up by the surface coil arrangement during this MR examination are processed by the receiving and processing unit 8 so as to form a respective MR image for each surface coil being part of the device 10. The location-dependent image values determined for the individual pixels of these high-resolution MR images will be referred to as $H_i$ hereinafter, the index i characterizing the surface coil 101 ... 104 with which the MR image has been picked up. Even if the object 12 to be examined were to have fully isotropic properties, the values thus formed would be dependent on the position of the relevant pixel because of the location-dependent coil sensitivity.

Therefore, two MR auxiliary measurements are carried out a-priori (or a-posteriori) in order to determine the spatial dependency of the sensitivity of the surface coil arrangement. Because the sensitivity changes only relatively slowly as a function of location, a low spatial resolution (for example, 32×32) suffices.

This requires only a small number of MR echos. Therefore, the use of a single sequence (single-shot EPI) suffices; this sequence in principle deviates from the exemplary sequence explained with reference to FIG. 3 only in that it need not be repeated. The sequence has a duration of, for example only 45 ms. The sequence excites the nuclear magnetization in the same slice as during the MR examination or in a neighbouring slice.

Such an MR auxiliary measurement is carried out on the one hand by means of the surface coil arrangement 10 and on the other hand by means of the body coil arrangement 9. Per surface coil the receiving and processing unit 8 produces an MR image from the MR signals produced by the surface coil arrangement 10. The image values of the pixels in this low-resolution MR image are referred to as $L_i$, where i characterizes the respective surface coil. The image values of the (also low resolution) MR image generated by means of the body coil arrangement are denoted as B.

According to a first method for the correction of the MR image data acquired by the MR examination, for each pixel of the MR images acquired during the MR auxiliary measurements by means of the surface coil arrangement there are calculated the image values L' of an MR superposition image according to the equation $$L' = \sqrt{\sum_i L_i^2} \qquad (1)$$

as the square root of the sum of the squares of the image values $L_i$ supplied for the respective pixel by the individual coils of the surface coil arrangement. The MR superposition image composed of the image values L' and having a low resolution is location-sensitive in the same way as the MR images wherefrom it is derived.

Analogously, from the MR image values $H_i$ associated with the high-resolution MR images from each coil, acquired during the MR examination, the image values H' of a high-resolution MR superposition image are calculated according to the equation:

$$H' = \sqrt{\sum_i H_i^2} \qquad (2)$$

Even though the image values L', H' have not yet been corrected with respect of the location-dependent sensitivity of the surface coil arrangement, the effect of the small image values (i.e. image values are comparatively strongly affected by noise) is reduced due to the summing over the squares of the image values $L_i$ and $H_i$ supplied by the individual coils of the surface coil arrangement.

The correction is carried out by means of a calibration factor C which is calculated from the values L', calculated according to equation (1), and from the image values B of the MR image generated by the MR auxiliary measurement by means of the body coil arrangement, according to the equation $$C = \frac{L' \cdot B}{|L'|^2 + r_1} \qquad (3)$$

The term r in the denominator is a regularization parameter which reduces the effect of noise for pixels which are associated with a region in the examination zone in which only weak or no MR signals arise.

Using these auxiliary values and the image values H' calculated according to the equation (2), the image values H of a high-resolution MR superposition image which has been corrected with respect to the location-dependent sensitivity of the surface coil arrangement are calculated in conformity with the formula $$H = C \cdot H' \qquad (4)$$

The MR image composed of the image values H is substantially free from the effects of the locally inhomogeneous sensitivity of the surface coils, but is not yet optimum in respect of the signal-to-noise ratio.

A method which has been improved in this respect is based on a simplification of the formula given by Römer et al. (Magn. Reson. Med. 16, 192, 1992):

$$H = C \cdot \sum_i a_i^* \cdot H_i \text{ where } 1 \leq i \leq i_{max} \qquad (5)$$

Therein, $i_{max}$ denotes the number of surface coils, C denotes a brightness function producing the overall brightness compensation or a location-dependent calibration factor, and $a_i^*$ denotes the complex value conjugate of the (complex) sensitivity distribution $a_i$ of the surface coil i. The location-dependent factors C and $a_i$ are calculated from the MR auxiliary measurements. For $a_i$ it holds that:

$$a_i = \frac{L_i \cdot B^*}{|B|^2 + r_2} \quad (6)$$

$L_i$ denotes the image value of the $i^{th}$ surface coil for the relevant pixel and B denotes the image value formed for the same pixel by the body coil arrangement. $B^*$ is the complex value conjugate of B, and $r_2$ is a further positive regularization parameter.

If the surface coil arrangement were formed by a single coil only and if r were equal to 0, the sensitivity $a_1$ of this coil (for a single coil i=1), calculated according to the equation (6), would become $a_1 = L_1/B$.

If all values B are strongly affected by noise, for example because no hydrogen atoms but air is present in the body region of the patient with which the respective pixel is associated, the effect of noise is counteracted by the regularization parameter $r_2$. Therefore, this parameter should be chosen so that its effect on $a_i$ is noticeable only for the pixels in which only a small MR signal or even no MR signal can arise because of the nuclear magnetization distribution or the proton density in the body.

After values $a_i$ have thus been determined in conformity with the equation (6) from the MR images resulting from the two MR examinations, for each coil of the surface coil arrangement and for each pixel, the associated image values $H_i$ of these high-resolution MR images are multiplied by the value $a_i$ valid for the relevant pixel and summed in a complex fashion, so that an MR superposition image H' is obtained in conformity with the equation:

$$H' = \sum_i a_i^* \cdot H_i \quad (7)$$

An MR image formed from the values H' has an improved signal-to-noise ratio, but not yet a globally uniform brightness distribution. In order to obtain such a brightness distribution, analogously with the equation (7) values L' are calculated from the MR data $L_i$, acquired by the MR auxiliary measurement by means of the surface coil arrangement, according to with the equation $$L' = \sum_i a_i^* \cdot L_i \quad (8)$$

From the values L', influenced in the same way by the locally inhomogeneous sensitivity of the surface coils as the values H', the calibration factor C corresponding to the brightness function is calculated according to with the equation $$C = \frac{L'^* \cdot B}{|L'|^2 + r_3} \quad (9)$$

Where $L'^*$ is the complex value conjugated of L' and $r_3$ is a suitably chosen regularization parameter. This results in a calibrated superposition image according to the equation:

$$H = C \cdot H' \quad (10)$$

Figure 4:
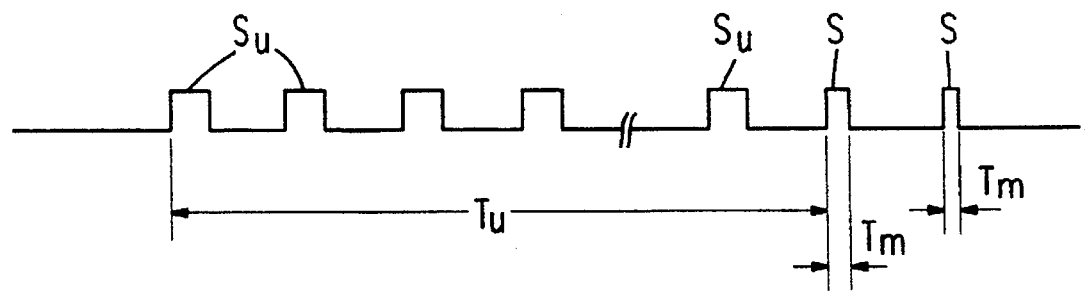
FIG. 4 shows the execution in time of the MR examination and the MR auxiliary measurements.

FIG. 4 again shows the complete execution in time of the MR examination and the two MR auxiliary measurements. The MR examination consists of a plurality of sequences $S_u$ whose variation in time is shown in FIG. 3. As has already been stated, the duration $T_u$ of the MR examination is determined less by the duration of the individual sequences $S_u$ than by the number of these sequences and by the distance in time with which they succeed one another. The MR auxiliary measurement by means of the surface coil arrangement on the one hand and the body coil arrangement on the other hand, during which only one sequence S acts on the examination zone, results in only a short duration $T_m$ and the resulting prolongation of the MR measuring time basically corresponds to the distance in time between the two sequences (approximately from 1 to 2 s). Even though overall MR signals are three times in total acquired in order to produce MR images, the time required for this acquisition is only insignificantly longer than the time $T_u$ required for the MR examination alone. The RF load for the patient is also only insignificantly increased, because only two sequences, i.e. substantially fewer sequences than during the MR examination, act on the examination zone during the two MR auxiliary measurements.

The sequences $S_u$ and S can in principle occur in an arbitrary order; however, for the two MR auxiliary measurements the sequence should immediately follow each other for practical reasons.

When a high-resolution MR image is to be formed from a number of closely neighbouring, parallel slices in the examination zone, it is not necessary to carry out two MR auxiliary measurements for each of these slices. The auxiliary values a and $a_i$ change only gradually as a function of the location, so that they can be used throughout a region in which the coil sensitivities do not change excessively. To this end, they should preferably be derived from MR auxiliary measurements carried out on comparatively thick slices. The same holds when a high-resolution three-dimensional MR auxiliary measurement is to be carried out.

When a temporal sequence of MR images is to be acquired from an examination zone, it is likewise not necessary to repeat the MR auxiliary measurements. For as long as the underlying coil geometry does not change, the auxiliary values C and $a_i$ once determined can be used further. This includes the case in which different MR sequences are used to produce the high-resolution MR images.

We claim:

1. An MR method for determining the nuclear magnetization distribution in an examination zone, comprising; acquiring image data during an MR examination by means of a surface coil arrangement including one or more individual coils having a locally inhomogeneous sensitivity; carrying out two respective MR auxiliary measurements, one by means of the surface coil arrangement and the other by means of a body coil arrangement having a locally at least approximately homogeneous sensitivity, the two MR auxiliary measurements being carried out temporally separate from one another and from the MR examination, and during the two MR auxiliary measurements the magnetic fields acting on the examination zone exhibiting the same temporal variation; deriving auxiliary values from data acquired during the two MR auxiliary measurements; and correcting the image data acquired during the MR examination by means of the surface coil arrangement on the basis of the auxiliary values.

2. An MR method as claimed in claim 1, wherein MR superposition images are calculated from the data acquired during the MR auxiliary measurement by means of the surface coil arrangement on the one hand and from those acquired during the MR examination on the other hand, which MR superposition images are dependent on the location-dependent sensitivity of the surface coil arrangement in the same way, and auxiliary values are derived from a relation of the MR superposition image obtained from the MR auxiliary measurement to the MR image obtained from the MR auxiliary measurement by means of the body coil arrangement which auxiliary values are used to correct the MR superposition image derived from the MR examination.

3. An MR method as claimed in claim 1, wherein the MR superposition images are formed by weighted summing of the MR images determined by the individual coils of the surface coil arrangement with the weighting factors that are applied to the MR image data of the individual MR images to be summed being derived from the relation of the respective MR image data determined for the same pixel during the two MR auxiliary measurements.

4. An MR method as claimed in claim 1, wherein the MR auxiliary measurements are confirmed for a spatial resolution lower than that for the MR examination.

5. An MR method as claimed in claim 1, characterized in that measuring times for the two MR auxiliary measurements are smaller than a measuring time required for the MR examination.

6. An MR device for determining a nuclear magnetization distribution, comprising:
   a) a surface coil arrangement which comprises one or more individual coils,
   b) a body coil arrangement of locally at least approximately homogeneous sensitivity,
   c) processing means for forming MR images from MR signals received from the surface coil arrangement and from the body coil arrangement as well as for deriving auxiliary values from the MR images,
   d) programmable control means for controlling a variation in time of the magnetic fields acting on the examination zone, and for controlling processing of the received MR signals, wherein the control means are programmed in such a manner that an MR examination an MR auxiliary measurement by means of the surface coil arrangement, and an MR auxiliary measurement by means of the body coil arrangement are carried out temporally separately, and that the processing means derives auxiliary values from data acquired during the MR auxiliary measurements, said auxiliary values being used to correct image data acquired during the MR examination.

7. A device as claimed in claim 6, wherein the surface coil arrangement and the body coil arrangement can operate in a receiving mode in which they can pick up MR signals and in a decoupling mode in which they cannot pick up MR signals, and that the modes are controlled by the control means in such a manner that the body coil arrangement operates in the decoupling mode when the surface coil arrangement operates in the receiving mode, and vice versa.

* * * * *